United States Patent
Kim et al.

(10) Patent No.: US 9,001,578 B2
(45) Date of Patent: Apr. 7, 2015

(54) SOFT ERASURE OF MEMORY CELLS

(75) Inventors: YoungPil Kim, Eden Prairie, MN (US); Dadi Setiadi, Edina, MN (US); Wei Tian, Eden Prairie, MN (US); Antoine Khoueir, Apple Valley, MN (US); Rodney Virgil Bowman, Bloomington, MN (US)

(73) Assignee: Seagate Technology LLC, Cupertino, CA (US)

( * ) Notice: Subject to any disclaimer, the term of this patent is extended or adjusted under 35 U.S.C. 154(b) by 393 days.

(21) Appl. No.: 13/610,433

(22) Filed: Sep. 11, 2012

(65) Prior Publication Data

US 2014/0071751 A1    Mar. 13, 2014

(51) Int. Cl.
G11C 11/34    (2006.01)
G11C 16/04    (2006.01)
G11C 16/16    (2006.01)
G11C 11/56    (2006.01)
G11C 16/14    (2006.01)

(52) U.S. Cl.
CPC ............ *G11C 16/16* (2013.01); *G11C 11/5628* (2013.01); *G11C 11/5635* (2013.01); *G11C 16/14* (2013.01)

(58) Field of Classification Search
CPC .... G11C 16/16; G11C 16/14; G11C 11/5628; G11C 11/5635
USPC ............ 365/185.03, 185.33, 185.29, 189.011
See application file for complete search history.

(56) References Cited

U.S. PATENT DOCUMENTS

| | | | |
|---|---|---|---|
| 5,930,174 A | 7/1999 | Chen et al. | |
| 7,702,989 B2 | 4/2010 | Graef et al. | |
| 7,835,194 B2 | 11/2010 | Aritome | |
| 8,076,709 B2 | 12/2011 | Ishimaru et al. | |
| 8,099,437 B2 | 1/2012 | Shapiro | |
| 2008/0291737 A1* | 11/2008 | Moon et al. | 365/185.19 |
| 2011/0176362 A1* | 7/2011 | Shibata et al. | 365/185.03 |

* cited by examiner

*Primary Examiner* — Toan Le
(74) *Attorney, Agent, or Firm* — Hall Estill Attorneys at Law

(57) ABSTRACT

Apparatus and method for managing data in a memory, such as but not limited to a flash memory array. In accordance with some embodiments, a soft erasure is performed on a block of memory cells by toggling an erasure status value without otherwise affecting a written state of the cells in the block. The memory cells are subsequently overwritten with a set of data using a write polarity direction determined responsive to the toggled erasure status value.

20 Claims, 7 Drawing Sheets

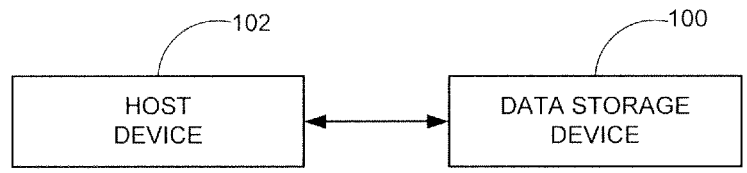
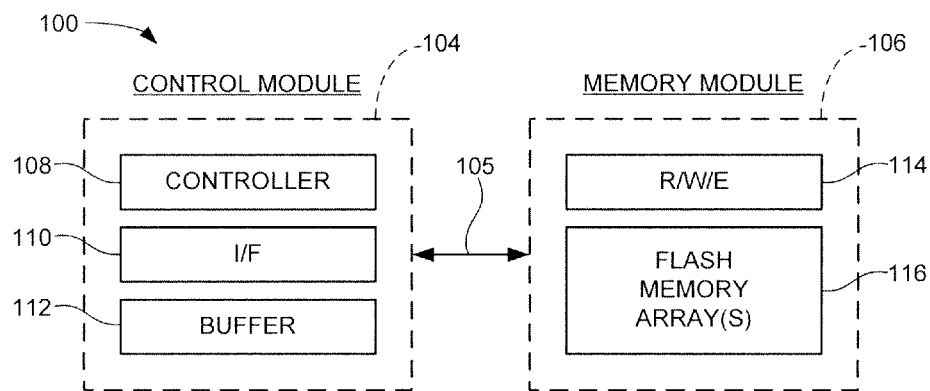
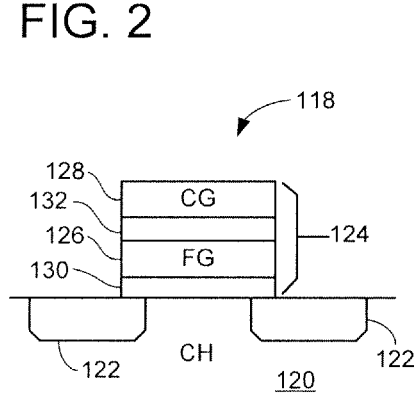
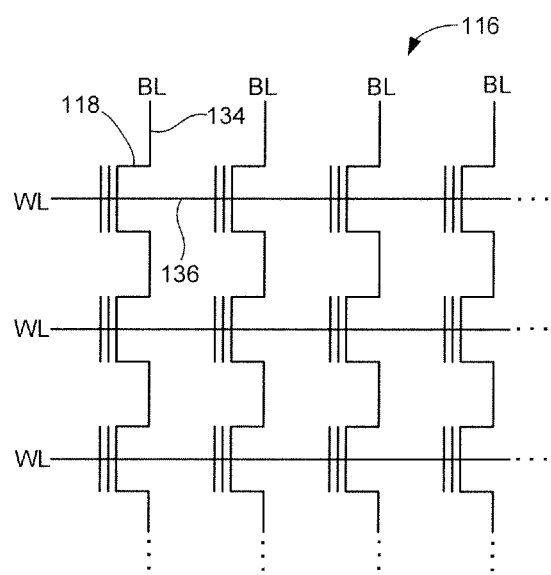
FIG. 1
FIG. 2
FIG. 3
FIG. 4

SOFT ERASURE OF MEMORY CELLS

SUMMARY

Various embodiments of the present disclosure are generally directed to the management of data in a memory, such as but not limited to a flash memory array.

In accordance with some embodiments, a soft erasure is performed on a block of memory cells by toggling an erasure status value without otherwise affecting a written state of the cells in the block. The memory cells are subsequently overwritten with a set of data using a write polarity direction determined responsive to the toggled erasure status value.

These and other features and advantages which may characterize various embodiments can be understood in view of the following detailed discussion and the accompanying drawings.

BRIEF DESCRIPTION OF THE DRAWINGS

FIG. 1 provides a functional block representation of an exemplary data storage device arranged to communicate with a host device in accordance with some embodiments.

FIG. 2 shows a block diagram representation of the data storage device of FIG. 1 in accordance with some embodiments.

FIG. 3 shows a flash memory cell construction that can be used in the device of FIG. 1.

FIG. 4 is a schematic depiction of a portion of a flash memory array using the cells of FIG. 3.

DETAILED DESCRIPTION

Figure 5:
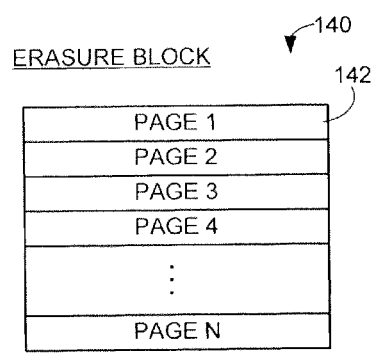
FIG. 5 illustrates an exemplary format for an erasure block formed of flash memory cells from FIG. 4.

The present disclosure generally relates to the management of data stored in a memory such as, but not limited to, a flash memory array.

A wide variety of data storage memories are known in the art. Some memories take the form of solid-state memory cells arrayed on a semiconductor substrate. Solid-state memory cells may store data in the form of accumulated electrical charge, selectively oriented magnetic domains, phase change material states, ion migration, and so on. Exemplary solid-state memory cell constructions include, but are not limited to, static random access memory (SRAM), dynamic random access memory (DRAM), non-volatile random access memory (NVRAM), electrically erasable programmable read only memory (EEPROM), flash memory, spin-torque transfer random access memory (STRAM), magnetic random access memory (MRAM) and resistive random access memory (RRAM).

These and other types of memory cells may be programmed to a selected state during a write operation, and the programmed state may be subsequently read during a read operation. A read operation may include the application of a read voltage threshold to the associated memory cell in order to sense the programmed state. An erasure operation can be applied to return a set of memory cells to an initial default programmed state.

Blocks of memory cells may be grouped together into garbage collection units (GCUs), which are allocated and erased as a unit. In some cases, GCUs may be formed by grouping together one erasure block from each plane and die in a memory device. This can enhance operational efficiency since generally only one operation (e.g., an erasure) can be carried out on a per plane and per die basis.

While operable, the application of an erasure operation to a group of cells can have a number of deleterious effects such as increasing the power consumption requirements of the memory, reducing I/O transfer rates, and decreasing the operational life of the memory due to wear and other physical effects. Some flash memory cells, for example, may be limited to a relatively low number of erasure cycles, such as 10,000 cycles, before exhibiting physical damage due to the repetitive migration of charge across the memory cell boundaries.

Accordingly, various embodiments disclosed herein are generally directed to improvements in the manner in which data may be managed in a memory. As explained below, memory cells are grouped together into blocks which are allocated and erased as a unit. The erasure of each block generally involves a specially configured erase operation, sometimes referred to herein as a "soft erase" or a "soft erasure," in which an erasure status flag bit (or other value) is toggled in order to carry out the erasure without otherwise affecting the current storage state of the cells in the block.

Thereafter, data are overwritten to the cells in relation to the status flag values. This reduces or eliminates the need to physically migrate large amounts of charge across cell boundaries to return the cells to a baseline programmed state as in conventional "hard" erasure operations.

These and other features of various embodiments can be understood beginning with a review of FIG. 1, which provides a simplified block diagram of a data handling system featuring a data storage device 100 coupled to a host device 102. The respective storage device 100 and host 102 can take any number of forms. In some embodiments, the storage device 100 is a portable memory device mated with the host 102 to provide a main memory for the host. The memory device 100 can be incorporated directly into the host 102, connected locally to the host 102, accessed by the host 102 via a network, etc.

FIG. 2 illustrates an exemplary construction for the storage device 100 of FIG. 1 in accordance with some embodiments. The device 100 includes a control module 104 and a memory module 106. The control module 104 provides top level control for the data storage system, and the memory module 106 provides a main data store. The memory module 106 is adapted to receive, process and execute commands issued to it by the control module 104 across a control/memory module communication interface 105.

The respective modules 104, 106 may take a variety of forms. A solid-state drive (SSD) application may incorporate both the control module 104 and the memory module 106 in an integrated, stand-alone assembly. In a hybrid disc drive application, the memory module 106 may include both flash and disc-based memory. A memory card application may incorporate some or all of the control module functionality in the host device 102 (FIG. 1).

The exemplary control module 104 in FIG. 2 is shown to include a controller 108, an interface (I/F) circuit 110 and a memory buffer 112. The controller 108 provides system level control functions for the device 100, including directing transfers of data between the host 102 and the memory module 106. The I/F circuit 108 processes interface communications with the host and with the memory module 106. The buffer 112 facilitates local storage of programming and control data used by the controller 108 as well as temporary storage of data during data access operations. Although not specifically depicted in FIG. 2, the control module 104 may provide additional functions such as data encryption/decryption, error detection and correction (EDC), etc.

The memory module 106 includes a read/write/erase (R/W/E) circuit 114 and one or more flash memory arrays 116. The R/W/E circuitry 114 operates to perform read, write and erasure functions upon the flash memory arrays 116 responsive to control inputs from the control module 104. While flash memory is used as an example in the current discussion, it will be appreciated that other forms of memory can be utilized.

The flash memory arrays 116 may be formed of individual flash memory cells 118, as generally depicted in FIG. 3. The flash memory cell 118 is formed on a semiconductor substrate 120 having spaced apart n+ doped regions 122. A gate structure 124 spans the pair of adjacent doped regions so that the flash cell takes a general nMOS transistor configuration. Additional flash cells can be formed on the substrate so that each adjacent pair of the n+ doped regions 122 is provided with an associated gate structure 124, providing multiple interconnected cells.

The gate structure 124 provides an alternating stack of electrically conductive gates 126, 128 and electrically insulative regions 130, 132. Data are stored by each cell 118 in relation to the relative amount of electrical charge stored on the lower gate 126, which is characterized as a floating gate (FG).

The floating gate 126 accumulates charge during a programming operation by the selected application of appropriate voltages to the adjacent doped (drain and source) regions 122 and the upper gate 128, characterized as a control gate (CG). These applied voltages induce the controlled migration of electrical charge from a channel (CH) portion of the semiconductor substrate 120 to the floating gate 126 across insulative region 130.

In an initial erased state, there will usually be substantially no accumulated charge on the floating gate. In this state, the cell will generally tend to exhibit drain-source conductivity across the channel without the application of voltage to the control gate. Once charge has been accumulated on the floating gate, the drain-source path will be non-conductive unless a sufficiently high gate control voltage is applied to the control gate, at which point the cell becomes conductive. The programmed state of the cell can be determined by observing the level of control gate voltage required to allow drain-source current to pass through the cell, which generally correlates to the amount of accumulated charge on the floating gate.

The cell 118 can be configured as a single-level cell (SLC) or a multi-level cell (MLC). An SLC stores a single bit; a normal convention is to assign the logical bit value of 1 to an erased cell (substantially no accumulated charge) and a logical bit value of 0 to a programmed cell (presence of accumulated charge). An MLC stores multiple bits, such as two bits (e.g., states 11, 01, 00 and 10). Generally, n bits can be stored using $2^n$ storage states.

Flash cells are often configured to undergo a conventional hard erasure operation to remove accumulated charge from the floating gate and return the cell to its initial baseline state in which no accumulated charge is present on the floating gate. Such hard erasures can be carried by the application of a relatively high voltage to the control gate to cause migration of substantially all of the charge from the floating gate 126 back to the substrate 120 across intermediate layer 130. At the conclusion of a hard erasure, the floating gate will be in a substantially neutral, uncharged state (e.g., substantially no excess electrons (n) or holes (p)).

Memory cells such as 118 in FIG. 3 can be arranged in the memory module 106 as an array of rows and columns of memory cells, as generally depicted in FIG. 4. Each column of adjacent cells can be coupled via one or more bit lines (BL) 134. The control gates 128 of the cells 118 along each row can be interconnected via individual word lines (WL) 136.

The array of memory cells shown in FIG. 4 may be grouped into erasure blocks 140, as depicted in FIG. 5. Each erasure block 140 may be a separately addressable block of memory and represents the smallest unit of memory that can be concurrent erased at a time. Each row of cells in an erasure block 140 may be referred to as a page 142, with each page accommodating a selected amount of user data. Block-level wear leveling may be employed to track the erase and write status of the various blocks 140. New blocks will be allocated for use as required to accommodate newly received data. Groups of erasure blocks 140 may be accumulated into larger garbage collection units (GCUs) 144 which are allocated, used and erased as a unit. GCUs 144 may take any suitable size.

In at least some embodiments, a full page worth of data is written to each page at a time. Multiple user data sectors of data (each having an associated logical address, such as a logical block address, LBA) may be written to the same page. Error correction codes such as parity bits may be incorporated at the page level to correct errors as a full page worth of data is retrieved. Metadata and other control information may be stored in each erasure block 140, or stored elsewhere such as in specific blocks dedicated to this purpose.

Figure 6:
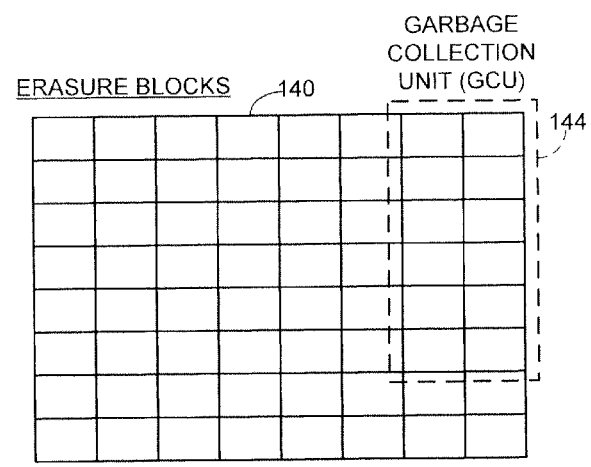
FIG. 6 shows erasure blocks as in FIG. 5 arranged into garbage collection units (GCUs).
Figure 7:
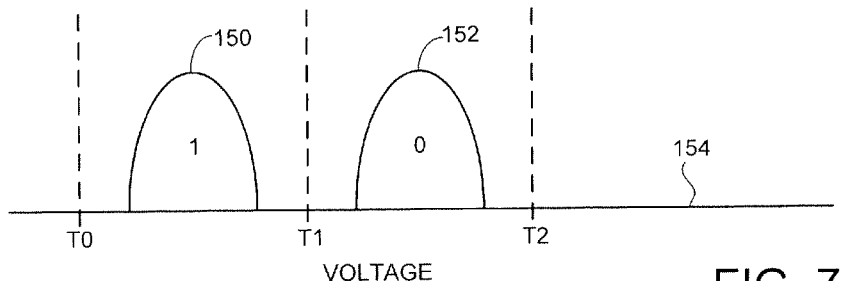
FIG. 7 graphically depicts different distributions of charge that may be stored in populations of SLC memory cells in the array of FIG. 6.

FIG. 7 illustrates exemplary normalized charge distributions 150 and 152 for different populations of the memory cells 118 in the array of FIG. 6 in accordance with some embodiments. The distributions are plotted against a common x-axis 154 indicative of voltage magnitude. The height of the respective distributions generally indicates cell population count.

The distributions 150 and 152 represent variations about nominal accumulated charge states in an SLC application, although the embodiments discussed herein can be extended to an MLC application as discussed below. The distribution 150 in FIG. 7 represents the cells programmed to a logical state of "1," so that there is substantially no accumulated charge on the floating gates of these cells. The distribution 152 represents the cells in the array that have been subjected to a programming operation to accumulate charge on their floating gates to achieve a programmed logical state of "0."

The respective charge distributions 150 and 152 are ideally non-overlapping to allow the application of suitable read-threshold voltages to differentiate between the various programmed states. Three such thresholds are depicted at T0, T1 and T2. Threshold T1 is a voltage level that, when applied to the control gates of the various memory cells, is sufficient to place all of the memory cells in distribution 150 into a source-drain conductive state, but insufficient to place the cells in distribution 152 into a conductive state. The higher threshold T2 is large enough to place all of the cells in a conductive state irrespective of their programmed state, none of the cells will be conductive responsive to application of the lower threshold T0. The thresholds T0-T2 may be positive voltages, negative voltages or a mixture of both.

Figure 8:
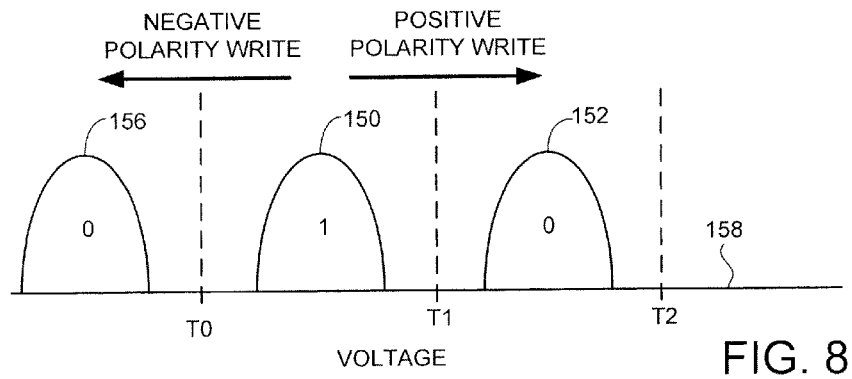
FIG. 8 graphically depicts bi-directional writing operations upon the memory cells of FIG. 6 in accordance with some embodiments.

FIG. 8 shows a third charge distribution 156 that may be additionally used in accordance with some embodiments. The third distribution 156 is to the left of distribution 150, and represents another population of cells in the array of FIG. 6 that have been programmed to a logical state of 0. The populations 150, 152 and 156 arise from the use of bi-directional programming operations upon the cells. Writes using a positive polarity transition cells from the distributions 150 and 156 to distribution 152; writes using a negative polarity transition cells from distributions 150 and 152 to distribution 156.

The central distribution 150 can represent those cells with substantially no charge (excess electrons (n)) in the floating gate structure 126 (see FIG. 3). The left-most distribution 156 can represent those cells with an excess of holes (p) due to electron depletion. While holes (p) do not exist as separate phenomena as in the case of electrons (n), from an overall system state standpoint holes (p) can be viewed as accumulating on the floating gate structure as electrons (n) continue to be driven to the channel. It will be appreciated, however, that the various distributions 150, 152 and 156 can represent any arbitrary levels of accumulated charge (n or p), including distributions that are all to the left, or the right, of the neutral distribution 150.

Figure 9:
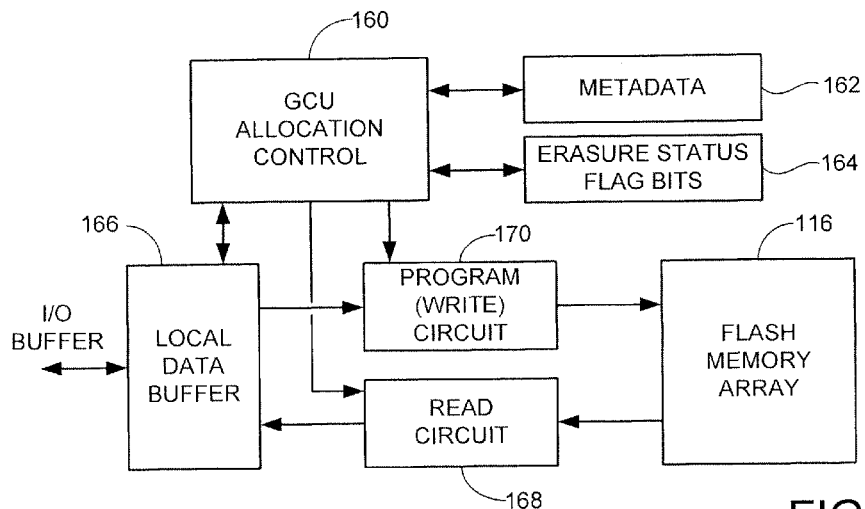
FIG. 9 is a functional block representation of a read/write/erasure (R/W/E) circuit of FIG. 2 in accordance with some embodiments.

FIG. 9 is a functional block representation of portions of the R/W/E circuit 114 of FIG. 2 in accordance with some embodiments. The circuit 114 includes a GCU allocation and control block 160 which provides top level control for the circuit during GCU allocations, data write and read operations upon allocated GCUs, and garbage collection operations in which various blocks in the memory array 116 are subjected to soft erasures and returned to service.

The GCU allocation and control block 160 (hereafter "control block 160") may be realized in hardware or firmware. In some embodiments, the control block 160 may be processor based, such as via controller 108 (see FIG. 2). The control block 160 utilizes metadata in a metadata store 162 and erasure flags in an erasure status flag bit store 164. The respective stores 162, 164 may constitute volatile or non-volatile memory accessible by the control block. In some embodiments, the metadata and the flags are stored in the array 116, including redundant copies thereof, and retrieved as required to local memory, such as during a system initialization or at times when these data are required to service a particular command.

The R/W/E circuit 114 further includes a local data buffer 166 which temporarily stores data pending transfer to or from the memory array 116. A read circuit 168 retrieves previously stored data from the array. A program (write) circuit 170 writes data to the array.

Figure 10:
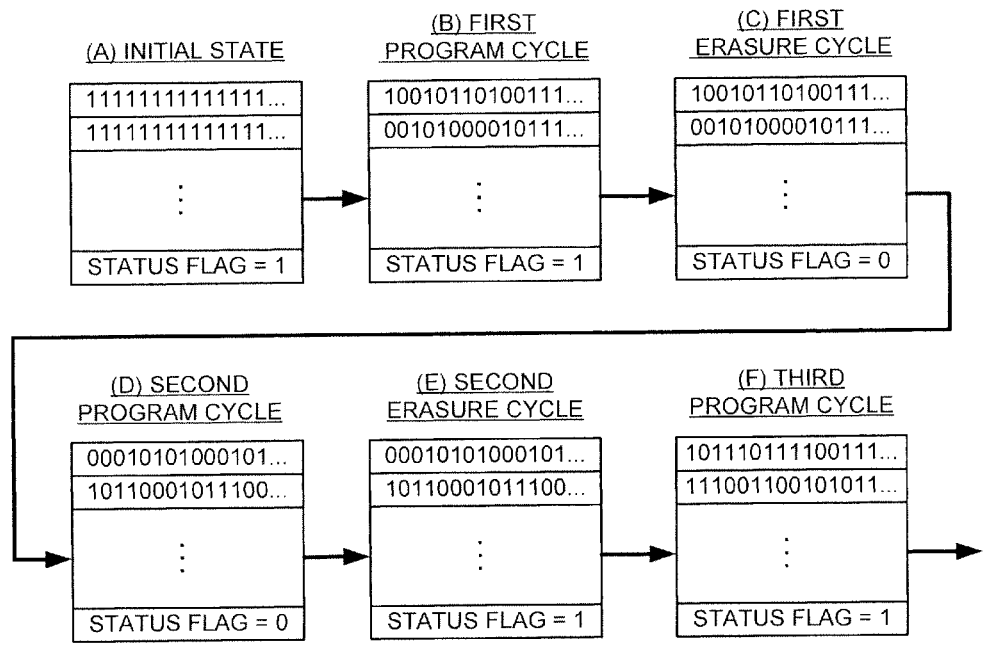
FIG. 10 illustrates a sequence of R/W/E cycles carried out by the circuit of FIG. 9 upon a selected erasure block from FIG. 6.

To understand an exemplary operational sequence of the control block 160, FIG. 10 provides a number of operational cycles that are sequentially carried out upon a selected group of memory cells. The cells may make up an erasure block, a GCU, a page, or some other grouping of cells that are erased as a group. Various cycles are denoted from state (A) to state (F), and continue on indefinitely as required.

State (A) in FIG. 10 represents an initial state in which each of the cells are initially in a hard erased (logical 1) state. The cells thus correspond to the distribution 150 in FIGS. 7 and 8 and have substantially no accumulated charge on the floating gate. A status flag for the block of memory cells is initialized to a value of 1.

State (B) in FIG. 10 represents a point in time after State (A) in which various data sets have been written to the cells. In some embodiments, the data are written after being presented to the local buffer memory 166 (FIG. 9) and processed by the write circuit 170. In order to write the presented data, those bit locations retaining a logical 1 are not subjected to a programming operation, and remain unchanged. Those bit locations shown to have a logical 0 are subjected to a programming operation to transition the cells from distribution 150 to distribution 152 in FIGS. 7 and 8, so that accumulated charge (n) is applied to the floating gates. The status flag remains equal to 1.

State (C) represents application of a first soft erasure cycle to the memory cells. This occurs responsive to the control block 160 determining that the block of memory cells should be erased and returned to service. This may be carried out via a specially configured garbage collection operation.

During the specially configured garbage collection operation, two main steps are carried out. First, any current revision data remaining within the block are copied to a new location (e.g., a different erasure block in a different GCU). Second, the status flag is toggled from 1 to 0.

Additional steps may be taken such as the setting of GCU control metadata indicating time stamp or other data to indicate completion of the erasure operation and availability of the memory block to receive new data. However, no express erasure operation is required to migrate charge from the cells across cell boundaries to return the cells to the uniform baseline erased state as depicted in State (A).

Continuing with FIG. 10, State (D) represents a second program cycle upon the selected memory block in which new data are presented for storage therein. The new data are overwritten onto the existing storage states of the cells. Different steps may be taken during the writing of the new data to the cells depending on (1) the current state of each cell and (2) the new state of each cell. These different steps will be discussed in turn.

A first situation involves those memory cells that are currently written to a logical state of 1, and the bit value to be written to those cells is also a logical 1. In this situation, no action is taken. Cells in this situation correspond to the distribution 150 in FIG. 8, and are in this distribution both before and after the writing operation.

A second situation involves bit locations (cells) currently written to a value of logical 1, and which are to be written to a new value of logical 0. These cells are transferred from distribution 150 to distribution 156 in FIG. 8 using a negative polarity write operation.

A third situation involves bit locations having an existing state of logical 0, and which are to be written to a logical 0. These cells are transferred from distribution 152 to distribution 156 in FIG. 8 using a negative polarity write operation.

A fourth and final situation involves those bit locations having an existing logical value of 0, and which are to be written to a logical 1. These cells are transferred from distribution 152 to distribution 150, again using a negative polarity write operation.

Continuing with FIG. 10, State (E) represents a second soft erasure cycle that is performed at the conclusion of State (D). Once again, the GCU control block 160 carries out a specially configured garbage collection operation to migrate any current data from the memory block to a new location, and toggles the status flag from 0 back to 1. Other metadata values may be set as well to indicate the memory block is ready to accept new data.

State (F) depicts a third program cycle in which a new set of data are written to the block after the special erasure of Step (E). The writing takes place in a fashion similar to that discussed above for State (D), except that positive polarity writes are used. As before, the actual steps taken will depend both on the existing state of each cell and the new value to be written to each cell (or other bit location).

For those cells currently written to a logical 1 and which are to be written to a logical 1, no action is taken and these cells remain in distribution 158 (FIG. 8). For those cells currently at logical 1 and which are to be written to logical 0, a positive polarity write operation is used to transfer those cells from distribution 150 to distribution 152. Cells currently written as logical 0 and which are to be written as logical 0 will undergo positive polarity write to transfer from distribution 156 to 152. Cells currently written as logical 0 and which are to be written as logical 1 will undergo positive polarity write to transfer from distribution 156 to 150.

The processing of the memory block in FIG. 10 continues on into the future with successive programming cycles and soft erasure cycles as required, with each erasure cycle essentially limited to the toggling of the erasure status flag bit. The direction of write (e.g., positive polarity or negative polarity) at any given time is determined in relation to the magnitude of the status flag bit. Positive polarity writes occur responsive to a first flag bit value (e.g., flag=1), and negative polarity writes occur responsive to a second flag bit value (e.g., flag=0). Other values and conventions can readily be used to signify the write direction.

As desired, hard erasures can be occasionally carried out to reset blocks to state (A). For example, after some selected number of soft erasures, such as 5-10 soft erasures, have been performed on a given block, the next erasure may be scheduled as a hard erase to reset all of the cells to a baseline state (e.g., all logical 1 s, etc.). Metrics can be used to detect population drift or other parametric operational characteristics and the ratio of hard/soft erasures can be adjusted accordingly to obtain optimum performance while reducing wear.

Figure 11:
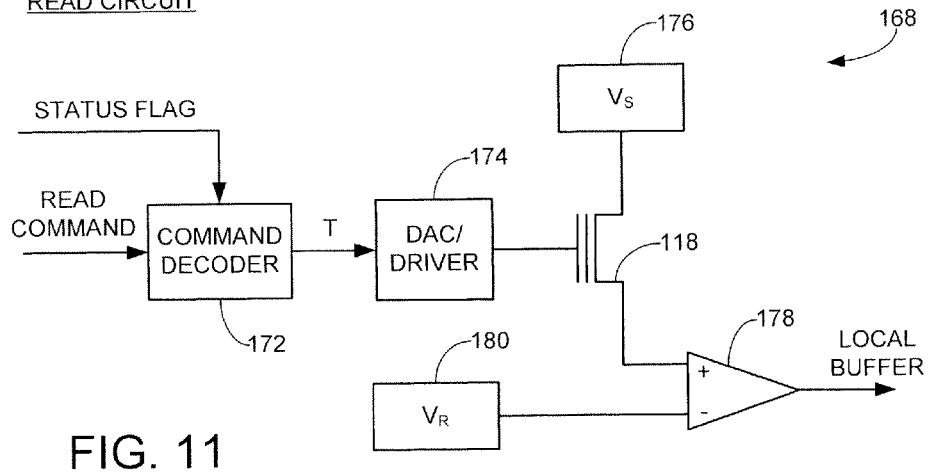
FIG. 11 depicts a read circuit portion of FIG. 9.

FIG. 11 is a functional block diagram of portions of the read circuit 168 of FIG. 9 in accordance with some embodiments. A read command to read data from a selected target address, such as a selected page 142 in a given erasure block 140, is provided to a command decoder 172. The associated status flag bit for the target address is also provided to the command decoder.

In response, the decoder 172 outputs a suitable digital threshold (T) value to a digital-to-analog (DAC) driver circuit 174, which applies a corresponding analog control gate voltage to each cell 118 at the designated address in turn. The voltage is passed along the appropriate word line (WL) and may correspond to one or more of the voltages T0-T2 in FIGS. 7-8, or some other appropriate read threshold value. A voltage source 176 supplies a source voltage $V_S$ to the bit lines (BL) coupled to the memory cell 118. Source-drain conductivity through the cell is detected in a suitable fashion, such as via comparator 178 and reference voltage source 180 which outputs a reference voltage $V_R$ which is compared to the voltage from memory cell 118.

Figure 12:
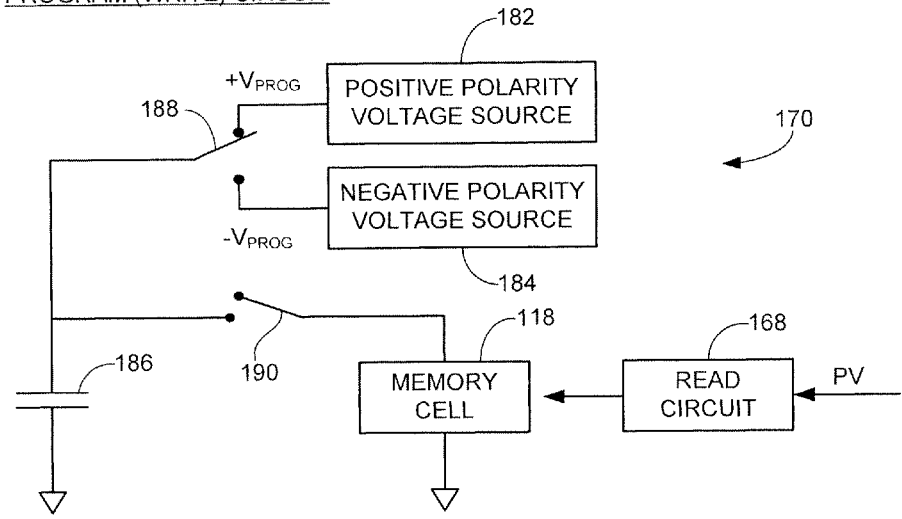
FIG. 12 shows a write circuit portion of FIG. 9.

FIG. 12 illustrates portions of the program (write) circuit 170 of FIG. 9 in accordance with some embodiments. A selected memory cell 118 is programmed to a selected program state using a dual polarity charge pump arrangement that includes a positive polarity voltage source 182, a negative polarity voltage source 184, a capacitor 186, a first switch 188 and a second switch 190. Other circuitry can be incorporated as well, such as command decoder circuitry which decodes the value of the flag bit to determine which voltage source 182, 184 to use.

During operation, the switch 188, which may take the form of a MOSFET power transistor network, connects the appropriate voltage source 182, 184 to the capacitor 186 to charge the capacitor to a suitable level. The positive polarity voltage source 182 is used for writes in the positive polarity direction, and the negative polarity voltage source 184 is used for writes in the negative polarity direction. The voltage magnitudes may be the same or different. In some embodiments, the source 182 provides a $+V_{PROG}$ voltage of about +5 VDC to about +20 VDC and the source 184 provides a $-V_{PROG}$ voltage of about −5 VDC to about −20 VDC. The voltages may be constant or increased in a step-wise fashion using increment step pulse programming (ISPP) techniques.

Once the capacitor 186 achieves a certain charge level, switch 190 closes and the charge is transferred to the control gate of the memory cell 118 to alter the charge state of the floating gate in the desired direction. In some embodiments, the read circuit 168 of FIG. 11 is used between charging cycles to perform a program verify (PV) operation to determine whether the cell 118 has reached the desired programming value. This may involve applying a program-verify threshold voltage to the control gate to determine whether the applied charge has been sufficient to place the programmed state of the floating gate above (or below) a selected level. Once it is verified that the cell 118 has reached the desired programming state, the write operation terminates.

Figure 13:
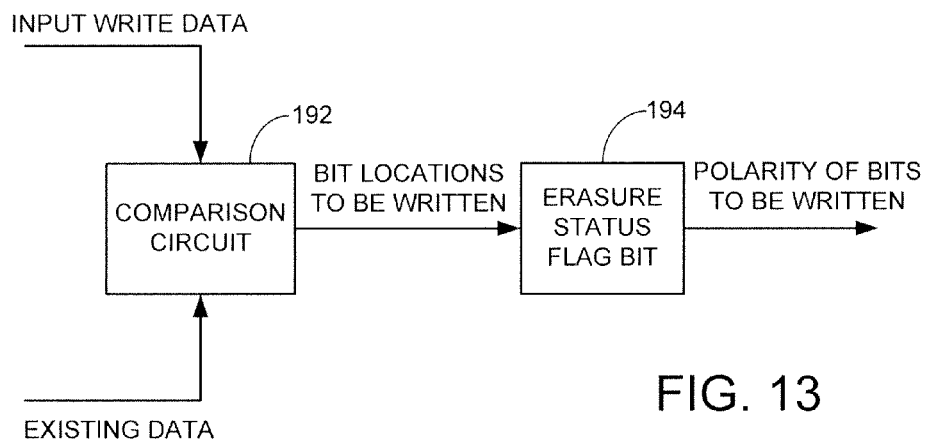
FIG. 13 illustrates operation of a garbage collection unit (GCU) allocation control block of FIG. 9.

FIG. 13 illustrates further circuitry that may be used during a write operation. A comparison circuit 192 compares input write data to existing data in the target memory location. The input write data may be supplied from an external host or from some other source. The existing data represent data that are to be overwritten by the input write data, and may be read from the memory location using the read circuit of FIG. 11. The comparison performed by circuit 192 can take any suitable form, such as an exclusive-or (XOR) to identify those bit locations which are different between the input write data and the existing data in the target location (target address).

A detection block 194 determines the value of the erasure status flag bit for the target address in order to determine the polarity of the bits to be written. These inputs are thereafter supplied to the write and read circuits 168, 170 to program the cells as discussed above.

Figure 14:
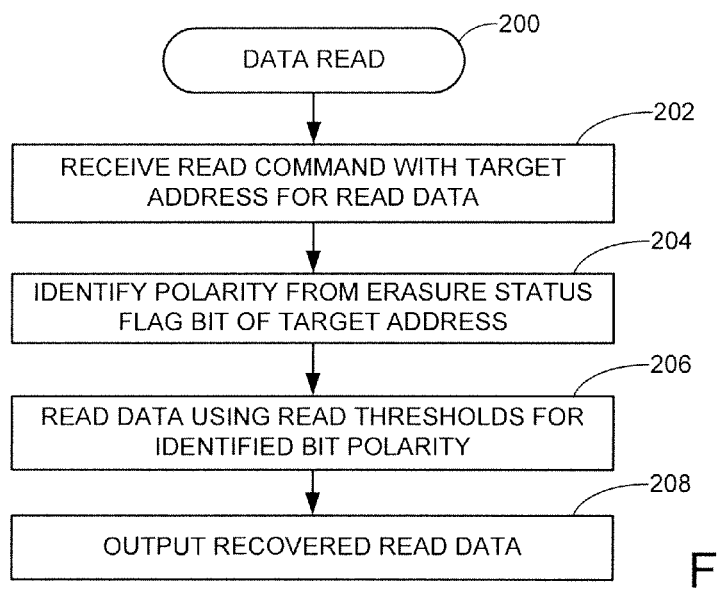
FIG. 14 is a flow chart for a DATA READ routine, illustrative of steps that may be carried out in accordance with various embodiments.

FIG. 14 is a flow chart for a DATA READ routine 200 to illustrate a read operation that may be carried out in accordance with the foregoing discussion to retrieve data from a memory, such as but not limited to the flash array of FIG. 6. A read command is received at step 202 which provides a request to retrieve read data from a target address in the memory. The read command may identify the target address using host level logical addressing (e.g., logical block address, LBA), which is converted to a physical address (e.g., physical block address, PBA) by an array controller.

Once the target physical address is known, the erasure flag value for the target address is identified at step 204. This will enable the system to determine the current polarity of the respective cells at the target address. With reference again to the example of FIGS. 8 and 10, a status flag of 1 means that the cells will be arranged in distributions 150 and 152, and a status flag of 0 will provide memory cells in distributions 156 and 150.

Once the distribution polarity is identified, suitable read thresholds are selected and applied to recover the data at step 206. The read threshold T1 in FIG. 8 is suitable for use during read operations with the status flag set equal to 1, and the read threshold T0 is suitable for use during read operations with the status flag set equal to 0. The read operation may take place as discussed above in FIG. 11 for each memory cell at the target address.

The recovered read data are thereafter output at step 208. This may include various data processing steps such as buffering, decryption, error detection and correction, and transfer of the data to the host device that initially issued the read command in step 202.

Figure 15:
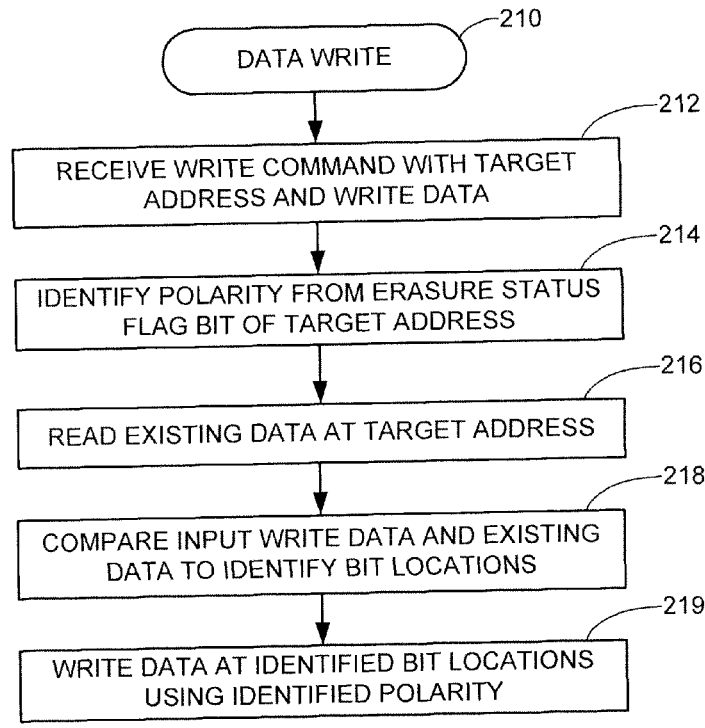
FIG. 15 is a flow chart for a DATA WRITE routine, illustrative of steps that may be carried out in accordance with various embodiments.

FIG. 15 is a flow chart for a DATA WRITE routine 210 to illustrate a write operation that may be carried out in accordance with the foregoing discussion to write data to the memory. A write command is received from a host device at step 212 that identifies a target address in the memory to which a set of input write data are to be written. Writeback processing may be used so that the host is issued a command complete status and the input write data are temporarily cached awaiting subsequent transfer to the memory. As before, the target address for the write data may be expressed as a logical address (e.g., one or more LBA(s)).

It is common in existing erasable memories to write each new version of a set of data to a new physical address and to mark older versions of the data in the memory as stale. Such processing can be used during the routine of claim 15, in which case the system identifies a corresponding new target address for the input write data, such as an available location in an allocated GCU.

However, it will be appreciated that the input write data for a given logical address can be directly overwritten to the same physical address that currently stores an older version of that same data. For example, if LBA X is currently stored in page Y of erasure block Z, and the write command provides a new version of LBA X to be written to the array, the routine can operate to overwrite the new version of LBA X to the Y/Z physical address. This can provide a number of benefits including simplified metadata structures since it may be easier to keep track of the physical locations of the various LBAs in the array if certain LBA ranges are assigned to associated GCUs, as used in other types of memories such as disc based memories (e.g., magnetic data recording media, etc.).

At step 214, the polarity of the currently written data at the target address is determined by consulting the flag bit value for the target address. As discussed above, this step will determine whether the memory cells are nominally arranged in distributions 150, 152 or 156, 150 in FIG. 8. The currently stored, existing data in the target address are next read at step 216. The read circuit of FIG. 11 will use appropriate read threshold values based on the polarity identified in step 214 to recover the currently stored existing data.

A comparison step next takes place at step 218 to compare the data bits in the existing data with the data bits in the set of input data, such as provided above in FIG. 13. This identifies the bit locations that are subsequently written at step 219. Other post processing steps may be taken at this time, such as metadata updates to identify the target address as storing the now most current version of the data.

Figure 16:
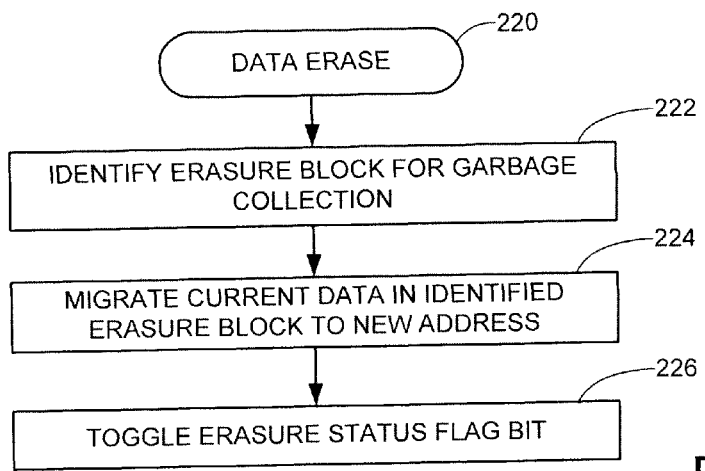
FIG. 16 is a flow chart for a DATA ERASE routine, illustrative of steps that may be carried out in accordance with various embodiments.

FIG. 16 is a flow chart for a DATA ERASE routine 220 to illustrate a write operation that may be carried out in accordance with the foregoing discussion to perform a soft erasure on a particular location in the memory. It will be noted that the soft erasures as specially configured herein are not limited by the physical construction of the memory; for example, the smallest unit of memory that can be subjected to a hard erasure in the flash memory array of FIG. 6 is the erasure block. Soft erasures, however, can be arbitrarily defined for any suitable grouping of cells, such as less than a full erasure block (e.g., a set of pages, a single page, less than a single page, a group of memory cells in a page, or even individual memory cells). The greater the resolution, though, the higher the overhead complexity will need to be vis a vis the status bit flags required to track soft erasure status and other metrics (e.g., erasure cycle count, etc.).

A block of cells to be subjected to a soft erasure is initially identified at step 222. A determination is made as to whether current version data are stored at the address of the block, and if so, the current version data are migrated to a new location at step 224. This may involve a write operation as generally discussed in FIG. 15. If no current data require migration, step 224 may be skipped. The soft erasure is thereafter carried out by toggling the erasure status flag bit for the block at step 226.

Figure 17:
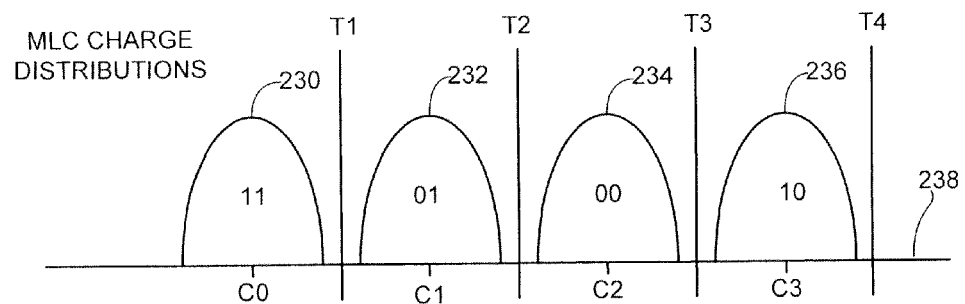
FIG. 17 provides graphically depicts different distributions of charge that may be stored in populations of MLC memory cells in the array of FIG. 6.

The bi-directional programming and soft erasure techniques disclosed herein can readily be extended to memory cells that utilize MLC (multi-level cell) programming. FIG. 17 shows exemplary charge distributions 230, 232, 234 and 236 for a set of memory cells in the array of FIG. 6 each adapted to store two bits per cell. The distributions are plotted along a voltage x-axis 238 and have corresponding charge levels on the floating gates of C0<C1<C2<C3. The corresponding logical states for these charge levels are 11, 01, 00 and 10 although other conventions can be used.

While not necessarily required, in some embodiments the most significant bit (MSB) of each cell corresponds to a logical bit value for a first set of data written to the cells, and the least significant bit (LSB) corresponds to a logical bit value for a second set of data written to the cells.

In this way, a first set of data can be written to a set of cells, such as the cells along a selected row in an erasure block, using SLC (single level cell) programming in a manner similar to that discussed in FIG. 7. The cells would thus be generally grouped into distribution 230 (C0) for those that remain at logical 1 and into distribution 234 (C2) for those written to a logical 0. The MSB of the logical values (e.g., left-most bit values) would correspond to the logical bits in this first set of data.

A second set of data can be subsequently written to the same set of cells so that some portion of the cells from distribution 230 (11) are transitioned to distribution 232 (01) and some portion of the cells from distribution 234 (00) are transitioned to distribution 236 (10). The LSB of the logical values (e.g., right-most bit values) would represent the logical bits in the second set of data.

Figure 18:
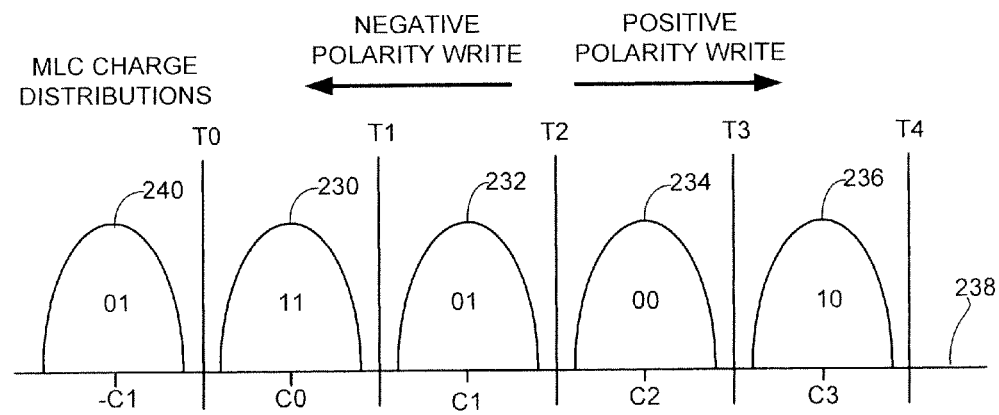
FIG. 18 graphically depicts bi-directional writing operations upon the memory cells of FIG. 17 in accordance with some embodiments.

FIG. 18 shows the distributions of FIG. 17 with an additional distribution 240 to the left of distribution 230. The distribution 240 is similar to the distribution 156 in FIG. 8 and is denoted as having a charge distribution of −C1 (which may or may not be the same magnitude as charge C1). As before, the distribution 230 can represent a hard erased situation where there is substantially no charge on the floating gates in those cells, and the distribution 240 can represent cells with excess holes (p). It will be appreciated, however, that other charge distributions can readily be used, including distributions that all appear to the right (or to the left) of the hard erased cells.

As before, the logical states of multiple data sets in MLCs can be written and updated using positive and negative polarity writes responsive to the erasure status flag value. In some cases, the new distribution 240 can also represent the logical value 01. In other cases, a different logical multi-bit value can be assigned to each distribution depending on the direction (polarity) of the writes.

It may make sense to perform both positive and negative writes on different cells during the same write operation for a given erasure status flag value to achieve the desired final distributions. It may also be desirable in some cases to have different charge levels correspond to the same data value (e.g., have cells with logical 01 in both distribution 236 and 240 at the same time).

Some flash memories (and other hard erasable devices) can be configured to add a small amount of charge for cells with the logical 1 (FIGS. 7-8) or logical 11 (FIGS. 17-18) states for reliability or other purposes. This can readily be incorporated into the various embodiments disclosed herein, and such cells will still be considered as having substantially no charge, or a neutral amount of charge.

While various embodiments have been discussed herein in the context of a flash memory, such is merely exemplary and not limiting. Any number of different types of volatile and non-volatile memories can be processed in accordance with the disclosed embodiments, including solid-state memories, disc-based memories, RRAM, STRAM, MRAM, NVRAM, rotatable magnetic recording discs, rotatable optical recording discs, buffer memories, caches, etc. Benefits may include reduced power consumption requirements, reduced processing overhead, reduced wear, increased I/O transfer rates and extended operational life.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A method comprising:
performing a soft erasure of a block of memory cells by toggling an erasure status value without otherwise affecting a written state of the cells in the block; and
subsequently overwriting a set of data to the block using a write polarity direction determined responsive to the toggled erasure status value.

2. The method of claim 1, further comprising writing a first set of data to the cells in the block using a first write polarity direction prior to the soft erasure, the data overwritten after the soft erasure comprising a second set of data written using an opposing second write polarity direction.

3. The method of claim 1, in which the block of memory cells comprises a block of erasable memory cells adapted to be returned to a baseline erased state during a hard erasure in which accumulated charge is removed from a floating gate of each of the cells, and in which the soft erasure is performed in lieu of a hard erasure.

4. The method of claim 1, in which the block of memory cells are flash memory cells.

5. The method of claim 1, in which the block of memory cells are SLCs.

6. The method of claim 1, in which the block of memory cells are MLCs.

7. The method of claim 1, in which the memory cells in the block are arranged to have different charge distributions corresponding to bits in the overwritten data, one charge distribution corresponding to a substantially neutral charge level, one distribution corresponding to a charge level with excess electrons (n), and one distribution corresponding to a charge level with excess holes (p).

8. The method of claim 1, wherein the soft erasure further comprises a garbage collection operation in which current revision data in the block of memory cells is copied to another memory location.

9. The method of claim 1, further comprising repeating the soft erasure and overwriting steps a plural number of times, followed by performing a hard erasure of the block of memory cells to transfer accumulated charge on floating gates thereof across cell boundaries to set the cells in a common baseline state responsive to the plural number.

10. An apparatus comprising:
a block of memory cells; and
a control circuit adapted to perform a soft erasure of the cells by toggling an erasure status value without otherwise affecting a written state of the cells, followed by overwriting a set of data to the block using a write polarity direction determined responsive to the toggled erasure status value.

11. The apparatus of claim 10, in which the block of memory cells is in a data memory array, and the control circuit is further adapted to garbage collect current data from the block of memory cells during the soft erasure so that the current data are copied to another location in the array.

12. The apparatus of claim 10, in which the control circuit directs the writing of data to the block of memory cells with a positive polarity direction responsive to a first erasure status value and directs the writing of data to be block of memory cells with an opposing negative polarity direction responsive to a second erasure status value.

13. The apparatus of claim 10, characterized as a flash memory.

14. The apparatus of claim 10, in which the control circuit is further adapted to subsequently perform a hard erasure of the block of memory cells by removing accumulated charge from a floating gate of each of the cells to place all of the cells in a common baseline erased state.

15. The apparatus of claim 10, in which the memory cells in the block are arranged to have different charge distributions corresponding to bits in the overwritten data, one charge distribution corresponding to a substantially neutral charge level, one distribution corresponding to a charge level with excess electrons (n), and one distribution corresponding to a charge level with excess holes (p).

16. An apparatus comprising:
a flash memory array arranged into a plurality of garbage collection units (GCUs) each allocated as a unit;
a hard erasure circuit adapted to perform a hard erasure on a selected GCU by removing accumulated charge from floating gate structures of flash memory cells in said GCU to return said cells to a baseline charge state;
a soft erasure circuit adapted to perform a soft erasure on the selected GCU by toggling an erasure status value without otherwise affecting a written state of the cells therein; and a write circuit adapted to overwrite data to the cells in the selected GCU using a write polarity direction determined responsive to the toggled erasure status value.

17. The apparatus of claim 16, further comprising a garbage collection circuit adapted to copy current revision data in the selected GCU to another GCU prior to said hard erasure and prior to said soft erasure operations.

18. The apparatus of claim 16, in which the write circuit directs the overwriting of data to a block of memory cells in the selected GCU with a positive polarity direction responsive to a first erasure status value and directs the overwriting of data to the block of memory cells with an opposing negative polarity direction responsive to a second erasure status value.

19. The apparatus of claim 16, in which the memory cells in the selected GCU are arranged to have different charge distributions corresponding to bits in the overwritten data, one charge distribution corresponding to a substantially neutral charge level, one distribution corresponding to a charge level with excess electrons (n), and one distribution corresponding to a charge level with excess holes (p).

20. The apparatus of claim 16, in which the memory cells in the selected GCU are MLCs.

* * * * *

UNITED STATES PATENT AND TRADEMARK OFFICE
CERTIFICATE OF CORRECTION

PATENT NO. : 9,001,578 B2  
APPLICATION NO. : 13/610433  
DATED : April 7, 2015  
INVENTOR(S) : YoungPil Kim et al.

Page 1 of 1

It is certified that error appears in the above-identified patent and that said Letters Patent is hereby corrected as shown below:

In The Specification

In Col. 12, line 40  
"to be" should be "to the"

Signed and Sealed this  
Seventeenth Day of May, 2016

Michelle K. Lee  
*Director of the United States Patent and Trademark Office*